United States Patent
Meigs et al.

(10) Patent No.: US 6,763,575 B2
(45) Date of Patent: Jul. 20, 2004

(54) PRINTED CIRCUIT BOARDS HAVING INTEGRATED INDUCTOR CORES

(75) Inventors: Jonathan Meigs, Bennington, VT (US); Wendy Herrick, Clifton Park, NY (US)

(73) Assignee: Oak-Mitsui Inc., Hoosick Falls, NY (US)

( * ) Notice: Subject to any disclaimer, the term of this patent is extended or adjusted under 35 U.S.C. 154(b) by 376 days.

(21) Appl. No.: 09/878,365

(22) Filed: Jun. 11, 2001

(65) Prior Publication Data

US 2002/0196119 A1 Dec. 26, 2002

(51) Int. Cl.$^7$ ............................................. H01R 43/00
(52) U.S. Cl. ......................... 29/825; 29/840; 29/846; 29/852; 29/832; 29/823; 174/261
(58) Field of Search ...................... 29/823, 846, 840, 29/852, 593, 832, 825; 174/261, 262, 264, 265

(56) References Cited

U.S. PATENT DOCUMENTS

| | | | | |
|---|---|---|---|---|
| 3,392,053 A | * | 7/1968 | Olson et al. | 264/129 |
| 3,998,601 A | * | 12/1976 | Yates et al. | 428/607 |
| 5,403,672 A | * | 4/1995 | Urasaki et al. | 428/607 |
| 5,437,914 A | * | 8/1995 | Saida et al. | 428/209 |
| 6,117,300 A | * | 9/2000 | Carbin et al. | 205/125 |
| 6,191,495 B1 | * | 2/2001 | Kossives et al. | 257/798 |

FOREIGN PATENT DOCUMENTS

| | | |
|---|---|---|
| DE | 4432725 C1 | 1/1996 |
| WO | WO 00/03568 | 1/2000 |

* cited by examiner

Primary Examiner—Joseph J. Hail, III
Assistant Examiner—Alvin J. Grant
(74) Attorney, Agent, or Firm—Roberts & Roberts, LLP

(57) ABSTRACT

A process for forming printed circuit boards having integral inductor cores. According to the invention, a thin nickel layer is formed on a copper foil. The copper foil structure is then laminated to a substrate such that the nickel layer is in contact with the substrate. The copper foil is removed, leaving the nickel layer on the substrate. Using photomechanical imaging and etching techniques known in the art, NiFe is plated and patterned directly on the nickel layer, thereby forming integral inductor cores of the substrate. This process of the present invention allows for the elimination of several steps used in known processes, while also reducing etch time and minimizing waste of NiFe.

39 Claims, 1 Drawing Sheet

PRINTED CIRCUIT BOARDS HAVING INTEGRATED INDUCTOR CORES

BACKGROUND OF THE INVENTION

1. Field of the Invention

The present invention relates to printed circuit boards. More particularly, the invention relates to printed circuit boards having integral inductor cores.

2. Description of the Related Art

Printed circuit boards are well known in the field of electronics, and are used for a wide variety of commercial and consumer electronic applications. Typically, printed circuit boards are produced by forming a metal pattern on a substrate in a desired configuration. One common conventional technique for forming a metal pattern on one or more surfaces of a printed circuit board includes providing a dielectric substrate clad with a metal, typically copper, on one or both sides. For the formation of a typical one-sided circuit board according to such a process, the copper cladding layer is usually applied by electroplating. A masking step is then performed wherein a photoresist is applied to the metal clad surface. The resist is imaged by placing a photo mask over the film, the photo mask having an image of the desired metal patterned formed therein. The resist, as covered by the photo mask, is then exposed to UV light. After the mask is removed, a developer solution is applied to the surface to dissolve and remove the resist in the areas of the circuit board where metalization is not desired. After developing, the remaining resist material is left covering the areas were metal is desired while the underlying copper is exposed in areas where metalization is not desired. The masked circuit board is then subjected to an etch step, wherein an etchant attacks and removes the copper in the unmasked areas.

It is known in the art to produce printed circuit boards having integrated magnetic components such as inductors and transducers. One known process is described in the International Journal of Microcircuits and Electronic Packaging, Vol. 23, Number 1, p.65–66. This process includes the formation of integrated magnetic components consisting of copper winding layers and NiFe magnetic layers and through holes. First, a surface of a substrate is prepared to receive a layer of electrodeposited NiFe. The surface is cleaned, then sprayed with a palladium activator solution and dried with hot air blowers. Since NiFe will not directly plate onto the palladium-activated surface, a thin layer of electroless nickel must first be deposited onto the entire surface of the substrate. This nickel layer forms a barrier to the palladium so that NiFe can be plated. A layer of NiFe is then plated onto the entire surface, and is patterned using photomechanical imaging and etching techniques. Any exposed areas of the nickel layer are removed, and the result is a substrate having integrated inductors.

Unfortunately, processes such as these are very time consuming due to the multiplicity of steps that must be performed, particularly the steps for preparing the substrate for deposition of NiFe. Furthermore, these processes tend to be very expensive due to the large amounts of waste that are formed. Thus, a need exists for a simpler, less wasteful, and less costly process for producing printed circuit boards having integrated inductors.

It has now been unexpectedly found that the present invention provides a solution to this problem. The present invention provides a process for forming a printed circuit board having integral inductor cores which eliminates several steps used in the known processes, while also reducing etch time and minimizing waste.

According to the invention, a thin nickel layer is applied to a copper foil according to the procedure described in WO 003568A1, "Improved Method for Forming Conductive Traces and Printed Circuits Made Thereby", incorporated herein by reference. According to the present invention, this copper foil structure is laminated to a substrate such that the nickel layer is in contact with the substrate. The copper foil is then removed, leaving the nickel layer on the substrate. Either of two approaches may then be taken to form integrated inductor cores on the substrate. In the first approach, a photoresist is applied onto the nickel layer. The photoresist is then imagewise exposed to actinic radiation and developed to thereby remove non-imaged areas of the resist while retaining imaged areas. A layer of NiFe is then deposited onto the portions of the nickel layer which underlies the non-imaged areas of the photoresist. The balance of the photoresist is then removed. In the second approach, a layer of NiFe is deposited onto the nickel layer. A photoresist is then applied onto the NiFe layer. The photoresist is imagewise exposed to actinic radiation and developed to thereby remove nonimage areas of the resist while retaining imaged areas. Those portions of the NiFe layer which underlie the nonimage areas of the photoresist from the nickel layer are then removed, as is the balance of the photoresist. After either of these approaches, at least a portion of the nickel layer may also be removed. This process results in the formation of printed circuit boards having integrated inductor cores.

SUMMARY OF THE INVENTION

The invention provides a process for forming a printed circuit board having integral inductor cores, which comprises:

a) providing an electrically conductive structure which comprises a copper foil having a layer of nickel disposed thereon;

b) laminating the conductive structure onto a first surface of an electrically non-conductive substrate, such that the nickel layer is in contact with the first surface of the substrate;

c) removing the copper foil from the conductive structure, thereby leaving the nickel layer on the first surface of the substrate;

d) removing any formed oxide on the nickel layer; and e) performing either step (i) or step (ii):

(i) applying a photoresist onto the nickel layer; imagewise exposing the photoresist to actinic radiation; developing the resist to thereby remove non-imaged areas while retaining imaged areas; depositing a layer of NiFe onto the nickel layer portions underlying the removed nonimaged areas of the photoresist; removing a balance of the photoresist; and optionally removing at least a portion of the nickel layer; thereby forming integral inductor cores on the first surface of the substrate;

(ii) depositing a layer of NiFe onto the nickel layer; applying a photoresist onto the NiFe layer; imagewise exposing the photoresist to actinic radiation; developing the resist to thereby remove non-imaged areas while retaining imaged areas; removing the NiFe layer portions underlying the removed non-imaged areas of the photoresist from the nickel layer; removing a balance of the photoresist; and optionally removing at least a portion of the nickel layer, thereby forming integral inductor cores on the first surface of the substrate.

The invention further provides a printed circuit board having integral inductor cores formed by a process comprising:
  a) providing an electrically conductive structure which comprises a copper foil having a layer of nickel deposited thereon;
  b) laminating the conductive structure onto a first surface of an electrically non-conductive substrate, such that the nickel layer is in contact with the first surface of the substrate;
  c) removing the copper foil from the conductive structure, thereby leaving the nickel layer on the first surface of the substrate;
  d) removing any formed oxide on the nickel layer; and
  e) performing either step (i) or step (ii):
    (i) applying a photoresist onto the nickel layer; imagewise exposing the photoresist to actinic radiation; developing the resist to thereby remove non-imaged areas while retaining imaged areas; depositing a layer of NiFe onto the nickel layer portions underlying the removed non-imaged areas of the photoresist; removing a balance of the photoresist; and optionally removing at least a portion of the nickel layer; thereby forming integral inductor cores on the first surface of the substrate;
    (ii) depositing a layer of NiFe onto the nickel layer; applying a photoresist onto the NiFe layer; imagewise exposing the photoresist to actinic radiation; developing the resist to thereby remove non-imaged areas while retaining imaged areas; removing the NiFe layer portions underlying the removed non-imaged areas of the photoresist from the nickel layer; removing a balance of the photoresist; and optionally removing at least a portion of the nickel layer, thereby forming integral inductor cores on the first surface of the substrate.

The invention still further provides inductor cores formed by a process comprising:
  a) providing an electrically conductive structure which comprises a copper foil having a layer of nickel disposed thereon;
  b) laminating the conductive structure onto a first surface of an electrically non-conductive substrate, such that the nickel layer is in contact with the first surface of the substrate;
  c) removing the copper foil from the conductive structure, thereby leaving the nickel layer on the first surface of the substrate;
  d) removing any formed oxide on the nickel layer; and
  e) performing either step (i) or step (ii):
    (i) applying a photoresist onto the nickel layer; imagewise exposing the photoresist to actinic radiation; developing the resist to thereby remove non-imaged areas while retaining imaged areas; depositing a layer of NiFe onto the nickel layer portions underlying the removed non-imaged areas of the photoresist; removing a balance of the photoresist; and optionally removing at least a portion of the nickel layer; thereby forming integral inductor cores on the first surface of the substrate;
    (ii) depositing a layer of NiFe onto the nickel layer; applying a photoresist onto the NiFe layer; imagewise exposing the photoresist to actinic radiation; developing the resist to thereby remove non-imaged areas while retaining imaged areas; removing the NiFe layer portions underlying the removed non-imaged areas of the photoresist from the nickel layer; removing a balance of the photoresist; and optionally removing at least a portion of the nickel layer, thereby forming integral inductor cores on the first surface of the substrate.

DETAILED DESCRIPTION OF THE PREFERRED EMBODIMENT

Figure 1:
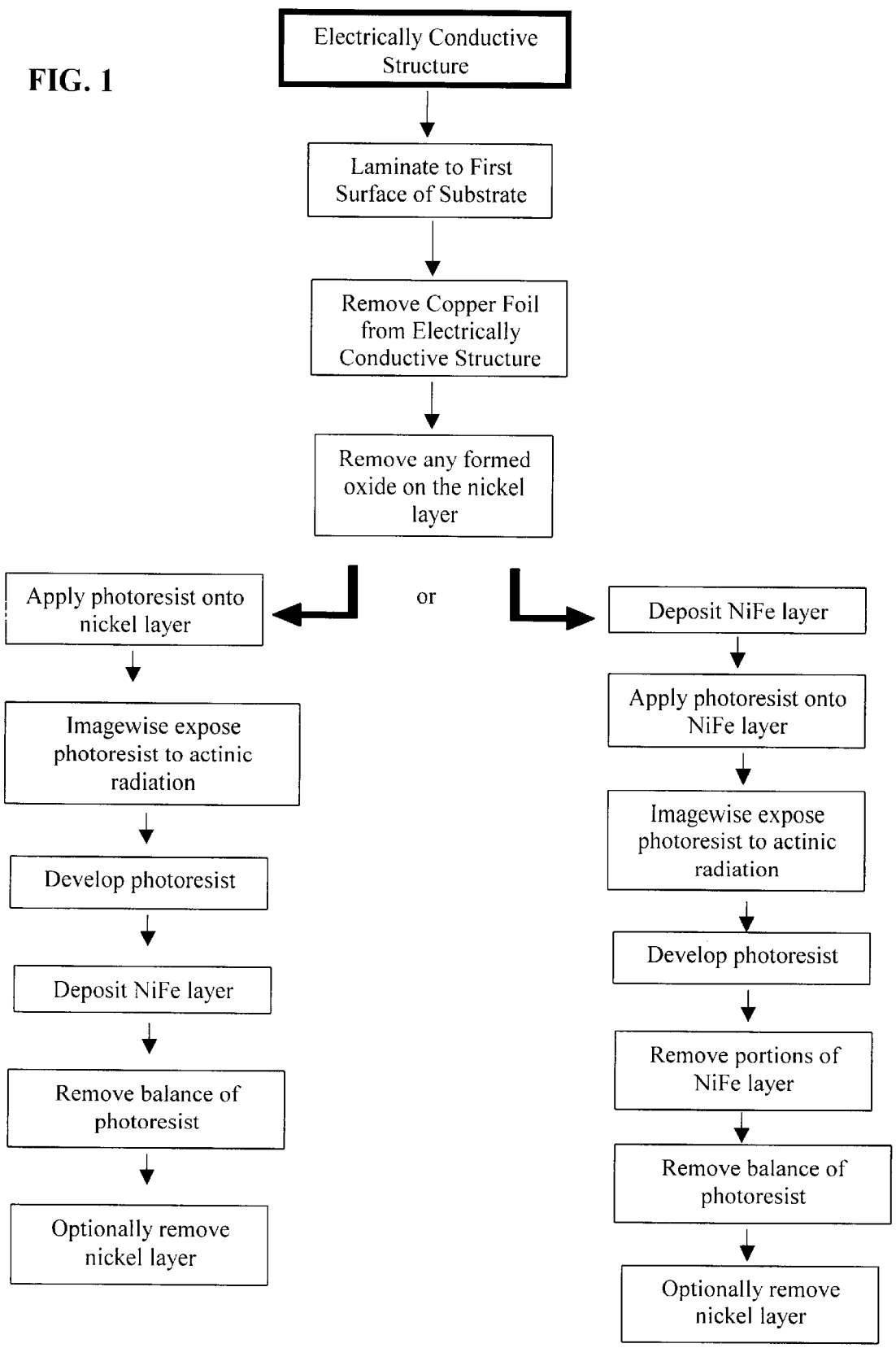
FIG. 1 shows a flow chart of the process of the present invention.

The invention provides process for forming a printed circuit board having integral inductor cores.

An electrically conductive structure is provided which comprises a copper foil having a layer of nickel deposited thereon. According to the invention, the term "copper foil" preferably comprises copper or copper alloys, but may also include copper foils containing zinc, brass, chrome, nickel, aluminum, stainless steel, iron, gold, silver, titanium and combinations and alloys thereof. The thickness of the copper foil may vary according to each particular application. In a preferred embodiment, the copper foil has a thickness of from about 5 $\mu$m to about 50 $\mu$m. Copper foils are typically manufactured by well known electrodeposition processes. One preferred process includes electrodepositing copper from a solution of a copper salt onto a rotating metal drum. The side of the foil next to the drum is typically the smooth or shiny side, while the other side has a relatively rough surface, also known as the matte side. This drum is usually made of stainless steel or titanium which acts as a cathode and receives the copper as it is deposited from solution. An anode is generally constructed from a lead alloy. A cell voltage of about 5 to 10 volts is typically applied between the anode and the cathode to cause the copper to be deposited, while oxygen is evolved at the anode. This copper foil is then removed from the drum. The foil's shiny side, matte side, or both, may optionally be pre-treated with a bond enhancing treatment known in the art, which may serve as an adhesion promoter for the copper foil.

The layer of nickel is applied onto one side of the copper foil to thereby form an electrically conductive structure. The nickel layer preferably includes nickel or a nickel alloy, but may also comprise other metals such as zinc, brass, chrome, nickel, aluminum, stainless steel, iron, gold, silver, titanium, and combinations and alloys thereof. The nickel layer may be applied to the copper foil by any conventional method such as by electrodeposition, sputtering or electroless plating. In a preferred embodiment, the nickel layer is deposited by electrodeposition. The thickness of the nickel layer may vary according to each particular application. In a preferred embodiment, the nickel layer has a thickness of from about 0.1 $\mu$m to about 5 $\mu$m.

Once formed, the electrically conductive structure is preferably laminated onto a first surface of an electrically non-conductive substrate having first and second opposite surfaces. The substrate preferably comprises an electrically non-conductive material. Suitable materials for the substrate nonexclusively include epoxies, polyimides, teflon, and polyesters. Preferably, the substrate comprises an epoxy. Laminating is preferably done using conventional lamination techniques known to those skilled in the art. The electrically conductive structure is preferably laminated onto the first surface of the substrate such that the nickel layer is in contact with the first surface of the substrate.

After lamination, the copper foil of the electrically conductive structure is preferably removed, thereby leaving the nickel layer on the first surface of the substrate. The copper foil may be removed using any conventional method which remove the copper foil but not the nickel layer. One preferred method of removing the copper foil is by etching. In a most preferred embodiment, the copper foil is etched away using an ammoniacal etchant.

Once the copper foil has been removed, any oxide formed on the nickel layer is removed. This may be done using any suitable conditioning step. Preferably, this is done by the cathodization process described in U.S. Pat. No. 6,117,300 which is incorporated herein by reference.

Next, integral inductor cores are formed on the first surface of the substrate. This may be done in any order and by any method known to those skilled in the art. According to a preferred embodiment of the present invention, integral inductor cores are formed on the first surface of the substrate by performing either step (i) or step (ii) as described below.

Step (i) includes applying a photoresist onto the nickel layer; imagewise exposing the photoresist to actinic radiation; developing the resist to thereby remove non-imaged areas while retaining imaged areas; depositing a layer of NiFe onto the nickel layer portions underlying the removed non-imaged areas of the photoresist; removing the balance of the photoresist; and optionally removing at least a portion of the nickel layer; thereby forming integral inductor cores on the first surface of the substrate.

Step (ii) includes depositing a layer of NiFe onto the nickel layer; applying a photoresist onto the NiFe layer; imagewise exposing the photoresist to actinic radiation; developing the resist to thereby remove non-imaged areas while retaining imaged areas; removing the NiFe layer portions underlying the removed non-imaged areas of the photoresist from the nickel layer; removing the balance of the photoresist; and optionally removing at least a portion of the nickel layer, thereby forming integral inductor cores on the first surface of the substrate.

In either of these steps, the photoresist may be positive working or negative working and is generally commercially available. Positive working photoresists are more preferred in the practice of the present invention. Suitable positive working photoresist materials are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. Suitable positive working photoresists may be obtained commercially, for example, under the trade name of AZ-P4620 from Clariant Corporation of Somerville, N.J. The photoresist may be applied by conventional means such as depositing by spin coating. The thickness of the photoresist may vary depending on the deposition procedure and parameter setup.

The photoresist is preferably imagewise exposed by conventional methods to thereby form both imaged and non-imaged areas. It is preferred that the photoresist is imagewise exposed using actinic radiation such as light in the visible, ultraviolet or infrared regions of the spectrum through a mask, or scanned by an electron beam, ion or neutron beam or x-ray radiation. Actinic radiation may be in the form of incoherent light or coherent light, for example, light from a laser.

The photoresist is then preferably imagewise developed by conventional methods to thereby remove the non-imaged areas while retaining the imaged areas. It is preferred that the photoresist is imagewise developed using a suitable solvent such as an aqueous alkaline solution. One preferred solvent developer comprises sodium carbonate. The balance of the photoresist may be subsequently removed by conventional methods known in the art such as stripping.

In both steps, a layer of NiFe is deposited onto the nickel layer. The NiFe layer preferably includes a nickel and iron alloy, but may also comprise other metals such as chrome, cobalt and combinations and alloys thereof. The NiFe layer may be deposited by any conventional methods such as electrodeposition, sputtering or electroless plating. In a preferred embodiment, the NiFe layer is deposited by electrodeposition. The thickness of the NiFe layer may vary according to each particular application. In a preferred embodiment, the NiFe layer has a thickness of from about 0.1 $\mu$m to about 25 $\mu$m.

Portions of the NiFe layer may subsequently be removed using any conventional method which removes the NiFe but not the nickel layer. One preferred method of removing the NiFe layer is by etching. In a most preferred embodiment, the NiFe is etched away using an ammonium hydroxide complex with copper.

Optionally but preferably, at least a portion of the nickel layer may subsequently be removed. The nickel layer may be removed using any conventional method such as etching. In a preferred embodiment, the nickel layer is removed by acid etching. Suitable acid etching materials nonexclusively include ferric chloride, cupric chloride, and combinations thereof.

The completion of either step (i) or step (ii) results in the formation of integral inductor cores on the first surface of the substrate.

Optionally but preferably, once the integral inductor cores are formed on the first surface of the substrate, one or more inductors may be formed onto an opposite second surface of the substrate. The inductors may be formed by the method described previously. In a preferred embodiment, each inductor formed on the second surface of the substrate is preferably in substantial alignment with an inductor core on the first surface of the substrate.

Optionally but preferably, a first electrically non-conductive support having first and second opposite surfaces may be attached onto the integral inductor cores on the first surface of the substrate. In a preferred embodiment, the first surface of the first electrically non-conductive support is attached to the first surface of the substrate. Suitable materials for the first electrically non-conductive support nonexclusively include fiberglass, epoxies, polyimides, polyesters, thermoplastics, and combinations thereof. Optionally, another electrically conductive structure according to the invention may be laminated onto the second surface of the first electrically non-conductive support. Additional integral inductor cores may optionally be formed according to the invention on the second surface of the first electrically non-conductive support.

Optionally but preferably, a second electrically non-conductive support having first and second opposite surfaces may be attached onto the one or more inductors on the second surface of the substrate. In a preferred embodiment, the first surface of the second electrically non-conductive support is attached to the second surface of the substrate. Suitable materials and thicknesses for the second electrically non-conductive support nonexclusively include those materials and thicknesses described above for the first electrically non-conductive support. Optionally, another electrically conductive structure according to the invention may be laminated onto the second surface of the second electrically non-conductive support. Additional integral inductor cores may optionally be formed according to the invention on the second surface of the second electrically non-conductive support.

Optionally but preferably, circuit elements may be formed on the first surface of the substrate at locations surrounding the integral inductor cores formed on the first surface of the substrate. Examples of circuit elements nonexclusively include electrically conductive lines and the like. Such circuit elements may be formed by well known lithographic techniques. Suitable materials for the circuit elements non-exclusively include aluminum, aluminum alloys, copper, copper alloys, titanium, tantalum, tungsten, and combinations thereof. These circuit elements typically form the conductors of an integrated circuit. Such circuit elements are typically closely separated from one another at distances preferably of from about 20 micrometers or less, more preferably from about 1 micrometer or less, and most preferably of from about 0.05 to about 1 micrometer.

In a most preferred embodiment, integral inductor cores are formed onto a first surface of a substrate according to the invention. Circuit elements are formed on the first surface of the substrate at locations surrounding the integral inductor cores. One or more inductors are formed onto the second surface of the substrate, each inductor being in substantial alignment with a core on the first surface of the substrate. A first surface of a first electrically non-conductive support is attached onto the integral inductor cores on the first surface of the substrate. Another electrically conductive structure according to the invention is formed and laminated onto a second surface of the first electrically nonconductive support. Additional integral inductor cores surrounded by additional circuit elements are then formed according to the invention on the second surface of the first electrically nonconductive support. A first surface of a second electrically non-conductive support is attached onto the one or more inductors on the second surface of the substrate. Another electrically conductive structure according to the invention is formed and laminated onto a second surface of the second electrically nonconductive support. Additional integral inductor cores surrounded by additional circuit elements are then formed according to the invention on the second surface of the second electrically nonconductive support.

Any number of additional electrically non-conductive supports having additional integral inductor cores or inductors formed thereon may be produced according to the invention.

The process of the present invention results in the formation of printed circuit boards having integral inductor cores.

The following non-limiting examples serve to illustrate the invention. It will be appreciated that variations in proportions and alternatives in elements of the components of the invention will be apparent to those skilled in the art and are within the scope of the present invention.

EXAMPLE 1

An electrically conductive structure, consisting of a copper foil having a nickel layer deposited thereon, is applied to a first surface of an epoxy substrate such that the nickel layer is in contact with the first surface of the substrate. This is then laminated under heat and pressure sufficient to flow and cure the epoxy, forming a laminate. The copper foil is etched away with an ammoniacal etchant, leaving the nickel layer on the first surface of the substrate. Any oxide formed on the nickel layer is then removed using the cathodization process described in U.S. Pat. No. 6,117,300.

Integral inductor cores are then formed on the first surface of the substrate. This is done by first applying a layer of AZ-P4620, a positive working photoresist material available commercially from Clariant Corporation of Somerville, N.J., onto the nickel layer to protect the nickel layer in areas where cores are not to be formed. The photoresist is imagewise exposed to actinic radiation using a laser, and developed with sodium carbonate to thereby remove non-imaged areas while retaining imaged areas. The non-imaged areas will be the sites of inductor core formation.

A layer of NiFe plating solution is then electrodeposited onto the nickel layer portions underlying the removed non-imaged areas of the photoresist. The NiFe plating solution comprises:

| | |
|---|---|
| $NiCl_2*6H_2O$ | 109 grams per liter |
| $FeCl_2*4H_2O$ | 1.85 grams per liter |
| $H_3BO_3$ | 12.5 grams per liter |
| Na Sacccharin | 0.4 grams per liter |
| Na Lauryl Sulfate | 0.4 grams per liter |
| $H_2O$ | to make up one liter |
| Plating Current Density | 18.5 ASF |
| pH = 2.5 | |

The balance of the photoresist is removed by stripping. A portion of the nickel layer is then removed by etching with cupric chloride. The result is the formation of integral inductor cores on the first surface of the epoxy substrate.

EXAMPLE 2

An electrically conductive structure, consisting of a copper foil having a nickel layer deposited thereon, is applied to a first surface of an epoxy substrate such that the nickel layer is in contact with the first surface of the substrate. This is then laminated under heat and pressure sufficient to flow and cure the epoxy, forming a laminate. The copper foil is etched away with an ammoniacal etchant, leaving the nickel layer on the first surface of the substrate. Any oxide formed on the nickel layer is then removed using the cathodization process described in U.S. Pat. No. 6,117,300.

Integral inductor cores are then formed on the first surface of the substrate. This is done by first depositing a layer of NiFe plating solution onto the nickel layer. The NiFe plating solution comprises:

| | |
|---|---|
| $NiCl_2*6H_2O$ | 109 grams per liter |
| $FeCl_2*4H_2O$ | 1.85 grams per liter |
| $H_3BO_3$ | 12.5 grams per liter |
| Na Sacccharin | 0.4 grams per liter |
| Na Lauryl Sulfate | 0.4 grams per liter |
| $H_2O$ | to make up one liter |
| Plating Current Density | 18.5 ASF |
| pH = 2.5 | |

Next, a layer of AZ-P4620, a positive working photoresist material available commercially from Clariant Corporation of Somerville, N.J., is deposited onto the NiFe layer. The photoresist is imagewise exposed to actinic radiation using a laser, and developed with sodium carbonate to thereby remove non-imaged areas while retaining imaged areas. Portions are then removed of the NiFe layer underlying the removed non-imaged areas of the photoresist. This is done by etching away the desired areas of NiFe using an ammonium hydroxide complex with copper.

The balance of the photoresist is removed by stripping. A portion of the nickel layer is then removed by etching with cupric chloride. The result is the formation of integral inductor cores on the first surface of the epoxy substrate.

EXAMPLE 3

Integral inductor cores are formed on the first surface of an epoxy substrate as described in Example 1. Integral inductor cores are then subsequently formed in the same manner on the second surface of the epoxy substrate such that each inductor core on the second surface is in substantial alignment with an inductor core on the first surface.

EXAMPLE 4

Integral inductor cores are formed on the first surface of an epoxy substrate as described in Example 2. Integral inductor cores are then subsequently formed in the same manner on the second surface of the epoxy substrate such that each inductor core on the second surface is in substantial alignment with an inductor core on the first surface.

EXAMPLE 5

Integral inductor cores are formed on the first surface of an epoxy substrate as described in Example 1. A first fiberglass support, having first and second opposite surfaces, is attached onto the integral inductor cores on the first surface of the substrate such that the first surface of the first fiberglass support is attached to the first surface of the substrate. Another electrically conductive structure, consisting of a copper foil having a nickel layer deposited thereon, is laminated onto the second surface of the first fiberglass support. Additional integral inductor cores are formed according to Example 1 on the second surface of the first fiberglass support.

EXAMPLE 6

Integral inductor cores are formed on the first surface of an epoxy substrate as described in Example 2. A first fiberglass support, having first and second opposite surfaces, is attached onto the integral inductor cores on the first surface of the substrate such that the first surface of the first fiberglass support is attached to the first surface of the substrate. Another electrically conductive structure, consisting of a copper foil having a nickel layer deposited thereon, is laminated onto the second surface of the first fiberglass support. Additional integral inductor cores are formed according to Example 2 on the second surface of the first fiberglass support.

EXAMPLE 7

Integral inductor cores are formed on the first surface of an epoxy substrate as described in Example 1. A first fiberglass support, having first and second opposite surfaces, is attached onto the integral inductor cores on the first surface of the substrate such that the first surface of the first fiberglass support is attached to the first surface of the substrate. A second fiberglass support, having first and second opposite surfaces, is attached onto the integral inductor cores on the second surface of the substrate such that the first surface of the second fiberglass support is attached to the second surface of the substrate. Another electrically conductive structure, consisting of a copper foil having a nickel layer deposited thereon, is laminated onto each of the second surface of the first fiberglass support and the second surface of the second fiberglass support. Additional integral inductor cores are formed according to Example 1 on the second surface of the first fiberglass support and on the second surface of the second fiberglass support.

EXAMPLE 8

Integral inductor cores are formed on the first surface of an epoxy substrate as described in Example 2. A first fiberglass support, having first and second opposite surfaces, is attached onto the integral inductor cores on the first surface of the substrate such that the first surface of the first fiberglass support is attached to the first surface of the substrate. A second fiberglass support, having first and second opposite surfaces, is attached onto the integral inductor cores on the second surface of the substrate such that the first surface of the second fiberglass support is attached to the second surface of the substrate. Another electrically conductive structure, consisting of a copper foil having a nickel layer deposited thereon, is laminated onto each of the second surface of the first fiberglass support and the second surface of the second fiberglass support. Additional integral inductor cores are formed according to Example 2 on the second surface of the first fiberglass support and on the second surface of the second fiberglass support.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A process for forming a printed circuit board having integral inductor cores, which comprises:
   a) providing an electrically conductive structure which comprises a copper foil having a layer of nickel disposed thereon;
   b) laminating the conductive structure onto a first surface of an electrically non-conductive substrate, such that the nickel layer is in contact with the first surface of the substrate;
   c) removing the copper foil from the conductive structure, thereby leaving the nickel layer on the first surface of the substrate;
   d) removing any formed oxide on the nickel layer; and
   e) performing either step (i) or step (ii):
      (i) applying a photoresist onto the nickel layer; imagewise exposing the photoresist to actinic radiation; developing the resist to thereby remove nonimage areas while not removing image areas; depositing a layer of NiFe onto the nickel layer portions underlying the removed non-imaged areas of the photoresist; removing a balance of the photoresist; and optionally removing at least a portion of the nickel layer; thereby forming integral inductor cores on the first surface of the substrate;
      (ii) depositing a layer of NiFe onto the nickel layer; applying a photoresist onto the NiFe layer; imagewise exposing the photoresist to actinic radiation; developing the resist to thereby remove non-imaged areas while retaining imaged areas; removing the NiFe layer portions underlying the removed non-imaged areas of the photoresist from the nickel layer; removing a balance of the photoresist; and optionally removing at least a portion of the nickel layer, thereby forming integral inductor cores on the first surface of the substrate.

2. The process of claim 1 further comprising forming one or more inductors onto an opposite second surface of the substrate, each inductor being in substantial alignment with a core on the first surface of the substrate.

3. The process of claim 1 further comprising attaching a first electrically nonconductive support onto the integral inductor cores on the first surface of the substrate.

4. The process of claim 2 further comprising attaching a second electrically nonconductive support onto the one or more inductors on the second surface of the substrate.

5. The process of claim 3 further comprising attaching a second electrically nonconductive support onto the one or more inductors on the second surface of the substrate.

6. The process of claim 3 further comprising repeating steps a) through e) by laminating another electrically conductive structure according to step a) onto the first electrically nonconductive support.

7. The process of claim 4 further comprising repeating steps a) through e) by laminating another electrically conductive structure according to step a) onto the second electrically nonconductive support.

8. The process of claim 6 further comprising repeating steps a) through e) by laminating another electrically conductive structure according to step a) onto the second electrically nonconductive support.

9. The process of claim 1 further comprising forming circuit elements on the first surface of the substrate at locations surrounding the integral inductor cores.

10. The process of claim 2 wherein the inductors comprise nickel or nickel iron.

11. The process of claim 3 wherein the first electrically nonconductive support comprises a combination of fiberglass and an epoxy.

12. The process of claim 4 wherein the second electrically nonconductive support comprises a combination of fiberglass and an epoxy.

13. The process of claim 1 wherein the copper foil has a thickness of from about 5 $\mu$m to about 50 $\mu$m.

14. The process of claim 1 wherein the nickel layer has a thickness of from about 0.1 $\mu$m to about 5 $\mu$m.

15. The process of claim 1 wherein the substrate comprises an epoxy.

16. The process of claim 1 wherein the copper foil is removed by etching.

17. The process of claim 1 wherein the copper foil is removed by etching with an ammoniacal etchant.

18. The process of claim 1 wherein the NiFe layer is deposited by electrodeposition.

19. The process of claim 1 wherein the NiFe is removed by etching.

20. The process of claim 1 wherein the NiFe is removed by etching with an ammonium hydroxide complex with copper acid.

21. The process of claim 1 wherein the nickel layer is removed in step (e).

22. The process of claim 1 wherein the nickel layer is removed by etching.

23. The process of claim 1 wherein the nickel layer is removed by etching with an acid.

24. The process of claim 1 wherein the nickel layer is removed by etching with an acid selected from the group consisting of ferric chloride, cupric chloride and combinations thereof.

25. A printed circuit board having integral inductor cores formed by a process comprising:
   a) providing an electrically conductive structure which comprises a copper foil having a layer of nickel disposed thereon;
   b) laminating the conductive structure onto a first surface of an electrically non-conductive substrate, such that the nickel layer is in contact with the first surface of the substrate;
   c) removing the copper foil from the conductive structure, thereby leaving the nickel layer on the first surface of the substrate;
   d) removing any formed oxide on the nickel layer; and
   e) performing either step (i) or step (ii):
      (i) applying a photoresist onto the nickel layer; imagewise exposing the photoresist to actinic radiation; developing the resist to thereby remove non-imaged areas while retaining imaged areas; depositing a layer of NiFe onto the nickel layer portions underlying the removed non-imaged areas of the photoresist; removing a balance of the photoresist; and optionally removing at least a portion of the nickel layer; thereby forming integral inductor cores on the first surface of the substrate;
      (ii) depositing a layer of NiFe onto the nickel layer; applying a photoresist onto the NiFe layer; imagewise exposing the photoresist to actinic radiation; developing the resist to thereby remove nonimage areas while not removing image areas; removing the NiFe layer portions underlying the removed nonimage areas of the photoresist from the nickel layer; removing a balance of the photoresist; and optionally removing at least a portion of the nickel layer, thereby forming integral inductor cores on the first surface of the substrate.

26. The printed circuit board of claim 25 further comprising forming one or more inductors onto an opposite second surface of the substrate, each inductor being in substantial alignment with a core on the first surface of the substrate.

27. The printed circuit board of claim 25 further comprising attaching a first electrically nonconductive support onto the integral inductor cores on the first surface of the substrate.

28. The printed circuit board of claim 26 further comprising attaching a second electrically nonconductive support onto the one or more inductors on the second surface of the substrate.

29. The printed circuit board of claim 27 further comprising attaching a second electrically nonconductive support onto the one or more inductors on the second surface of the substrate.

30. The printed circuit board of claim 27 further comprising repeating steps a) through e) by laminating another electrically conductive structure according to step a) onto the first electrically nonconductive support.

31. The printed circuit board of claim 28 further comprising repeating steps a) through e) by laminating another electrically conductive structure according to step a) onto the onto the second electrically nonconductive support.

32. The printed circuit board of claim 30 further comprising repeating steps a) through e) by laminating another electrically conductive structure according to step a) onto the second electrically nonconductive support.

33. The printed circuit board of claim 25 further comprising forming circuit elements on the first surface of the substrate at locations surrounding the integral inductor cores.

34. The printed circuit board of claim 26 wherein the inductors comprise nickel or nickel iron.

35. The printed circuit board of claim 27 wherein the first electrically nonconductive support comprises a combination of fiberglass and an epoxy.

36. The printed circuit board of claim 28 wherein the second electrically nonconductive support comprises a combination of fiberglass and an epoxy.

37. The printed circuit board of claim 25 wherein the nickel layer is removed in step (e).

38. A process for forming inductor cores which comprises:
- a) providing an electrically conductive structure which comprises a copper foil having a layer of nickel disposed thereon;
- b) laminating the conductive structure onto a first surface of an electrically non-conductive substrate, such that the nickel layer is in contact with the first surface of the substrate;
- c) removing the copper foil from the conductive structure, thereby leaving the nickel layer on the first surface of the substrate;
- d) removing any formed oxide on the nickel layer; and
- e) performing either step (i) or step (ii):
  - (i) applying a photoresist onto the nickel layer; imagewise exposing the photoresist to actinic radiation; developing the resist to thereby remove non-imaged areas while not retaining imaged areas; depositing a layer of NiFe onto the nickel layer portions underlying the removed non-imaged areas of the photoresist; removing a balance of the photoresist; and optionally removing at least a portion of the nickel layer; thereby forming integral inductor cores on the first surface of the substrate;
  - (ii) depositing a layer of NiFe onto the nickel layer; applying a photoresist onto the NiFe layer; imagewise exposing the photoresist to actinic radiation; developing the resist to thereby remove nonimage areas while not removing image areas; removing the NiFe layer portions underlying the removed nonimage areas of the photoresist from the nickel layer; removing a balance of the photoresist; and optionally removing at least a portion of the nickel layer, thereby forming integral inductor cores on the first surface of the substrate.

39. Inductor cores formed by a process comprising:
- a) providing an electrically conductive structure which comprises a copper foil having a layer of nickel disposed thereon;
- b) laminating the conductive structure onto a first surface of an electrically non-conductive substrate, such that the nickel layer is in contact with the first surface of the substrate;
- c) removing the copper foil from the conductive structure, thereby leaving the nickel layer on the first surface of the substrate;
- d) removing any formed oxide on the nickel layer; and
- e) performing either step (i) or step (ii):
  - (i) applying a photoresist onto the nickel layer; imagewise exposing the photoresist to actinic radiation; developing the resist to thereby remove nonimage areas while not removing image areas; depositing a layer of NiFe onto the nickel layer portions underlying the removed nonimage areas of the photoresist; removing a balance of the photoresist; and optionally removing at least a portion of the nickel layer; thereby forming integral inductor cores on the first surface of the substrate;
  - (ii) depositing a layer of NiFe onto the nickel layer; applying a photoresist onto the NiFe layer; imagewise exposing the photoresist to actinic radiation; developing the resist to thereby remove non-imaged areas while retaining imaged areas; removing the NiFe layer portions underlying the removed nonimage areas of the photoresist from the nickel layer; removing a balance of the photoresist; and optionally removing at least a portion of the nickel layer, thereby forming integral inductor cores on the first surface of the substrate.

* * * * *